(12) United States Patent
Schier

(10) Patent No.: US 8,025,991 B2
(45) Date of Patent: Sep. 27, 2011

(54) CUTTING TOOL WITH OXIDE COATING

(75) Inventor: Veit Schier, Echterdingen (DE)

(73) Assignee: Walter AG, Tubingen (DE)

( * ) Notice: Subject to any disclaimer, the term of this patent is extended or adjusted under 35 U.S.C. 154(b) by 631 days.

(21) Appl. No.: 11/661,110

(22) PCT Filed: Sep. 7, 2005

(86) PCT No.: PCT/EP2005/009595
§ 371 (c)(1),
(2), (4) Date: May 30, 2008

(87) PCT Pub. No.: WO2006/029747
PCT Pub. Date: Mar. 23, 2006

(65) Prior Publication Data
US 2010/0183884 A1    Jul. 22, 2010

(30) Foreign Application Priority Data
Sep. 14, 2004 (DE) .......................... 10 2004 044 240

(51) Int. Cl.
*B32B 9/00* (2006.01)
*B32B 19/00* (2006.01)
(52) U.S. Cl. ........................................ 428/698; 428/701
(58) Field of Classification Search .................. 428/698, 428/701
See application file for complete search history.

(56) References Cited

U.S. PATENT DOCUMENTS

| | | | |
|---|---|---|---|
| 4,746,563 A | 5/1988 | Nakano et al. | |
| 5,447,804 A | 9/1995 | Schulz et al. | |
| 5,766,782 A | 6/1998 | Ljungberg | |
| 5,827,570 A | 10/1998 | Russell | |
| 5,879,823 A | 3/1999 | Prizzi et al. | |
| 6,235,416 B1 | 5/2001 | Konig et al. | |
| 6,660,371 B1 | 12/2003 | Westphal et al. | |
| 2002/0051852 A1* | 5/2002 | Zywitzki et al. | 427/585 |
| 2003/0031805 A1* | 2/2003 | Deflinger et al. | 427/569 |
| 2004/0018393 A1* | 1/2004 | Fukui et al. | 428/698 |
| 2004/0081824 A1 | 4/2004 | Ljungberg | |

(Continued)

FOREIGN PATENT DOCUMENTS

DE      195 18 927 A1    1/1996

(Continued)

OTHER PUBLICATIONS

Machine English Translation of Japanese publication JP 2000-129445, Makoto et al., provided by the JPO website, retrieval date Aug. 24, 2010.*

(Continued)

*Primary Examiner* — Timothy M Speer
*Assistant Examiner* — Jonathan C Langman
(74) *Attorney, Agent, or Firm* — Drinker Biddle & Reath LLP

(57) ABSTRACT

By using the PVD process, cutting tools are provided with a coating that is a mono-phase ternary or more complex oxide. By appropriately defining the involved major component and minor component in terms of atom percent, the distortions of the formed oxide can be controlled in a specific manner and in order to influence the properties of said oxide. Alternatively, the layer may contain an amorphous oxide phase with oxide crystallites embedded therein. The oxide crystallites may be binary, ternary or more complex. One or more different types of crystallites may be present adjacent to each other.

7 Claims, 2 Drawing Sheets

U.S. PATENT DOCUMENTS

Figure 2:
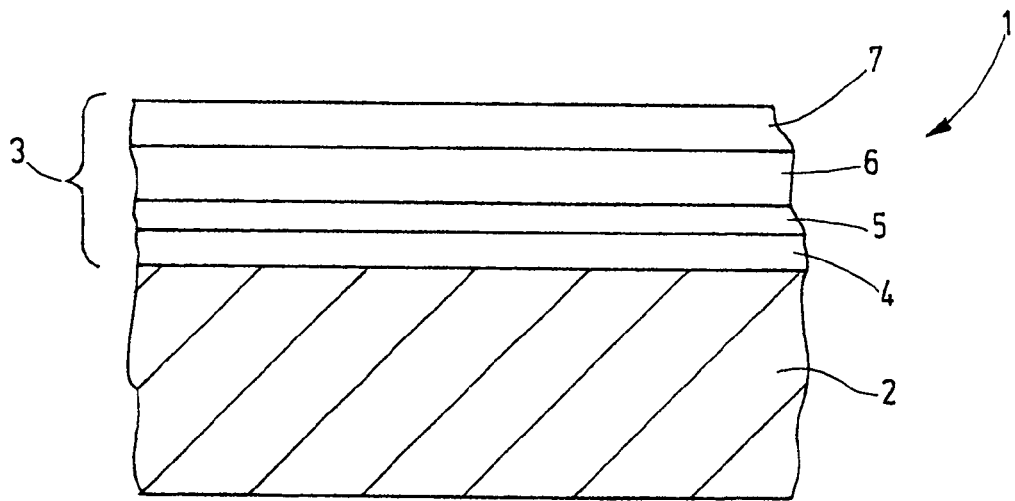

| | | | |
|---|---|---|---|
| 2004/0121147 A1* | 6/2004 | Morikawa et al. | 428/336 |
| 2005/0164042 A1* | 7/2005 | Hayahi et al. | 428/698 |

FOREIGN PATENT DOCUMENTS

| | | |
|---|---|---|
| DE | 196 51 592 A1 | 6/1997 |
| DE | 196 41 468 A1 | 4/1998 |
| DE | 197 37 470 A1 | 7/1998 |
| DE | 199 42 303 A1 | 3/2000 |
| EP | 1 253 215 A2 | 10/2002 |
| EP | 1 789 607 B1 | 3/2010 |
| JP | 2000-129445 | 5/2000 |
| JP | 2004-001154 | 1/2004 |
| WO | WO 92/17623 | 10/1992 |
| WO | WO 93/20257 | 10/1993 |
| WO | WO 2004/029321 | 4/2004 |
| WO | WO 2004/033751 | 4/2004 |

OTHER PUBLICATIONS

Chinese Office Action issued Dec. 5, 2008 issued in Chinese Application No. 200580030918X (including a translation thereof).

International Search Report mailed Jun. 28, 2006, in International application No. PCT/EP2005/009595.

* cited by examiner

CUTTING TOOL WITH OXIDE COATING

CROSS REFERENCE TO RELATED APPLICATIONS:

This application is the National Stage of International Application No. PCT/EP2005/009595 filed Sept. 7, 2005, and claims benefit of German Application No. 10 2004 044 2401 filed Sept. 14, 2004, which are incorporated herein in their entirety.

The invention relates to a cutting tool provided with a layer system that comprises at least one oxide layer.

It has been known to coat cutting tools with a layer system, which is comprised of, for example, metal hard substance layers, oxide layers or the like, in order to increase the stability or, also, in order to improve the cutting properties. Chemical vapor deposition (CVD) processes, as well as physical vapor deposition (PVD) processes, are used for coating. Also, existing hybrid processes can be used. The CVD processes are essentially restricted to the deposition of stable phases of desirable compounds to produce surface coats. Metastable phases of compounds can also be deposited with the use of PVD processes or hybrid processes.

Document DE 196 51 592 A1 discloses a cutting tool coated with a multi-layer layer system. The layer systems mentioned in various exemplary embodiments comprise, among other things, at least one aluminum oxide layer, as well as metal hard substance layers. The metal hard substance layers, for example, TiAlN coats deposited by PVD process. Also, for example, the aluminum oxide layer that is directly coated thereon is deposited by PVD process.

Aluminum oxide layers are binary oxide layers that have produced good results in practical applications. However, it has been attempted to improve these. Document EP 1253215 A2 discloses a cutting tool that has been coated with aluminum oxide by PVD process, in which case other layers, e.g., TiN coats may be present.

Also, in this case, the improvement of the properties of the $Al_2O_3$ coat is to be achieved.

Document DE 199 42 303 A1 discloses a cutting insert which has a multi-phase aluminum oxide layer. This layer, which has been produced by CVD process, contains $Al_2O_3$ (multi-phase aluminum oxide layer). The layer, which has been produced by CVD process contains $Al_2O_3$ (aluminum oxide, $ZrO_2$ (zirconium oxide), as well as a third finely dispersed phase consisting of an oxide, oxode carbide, oxode nitrite or oxode carbonitride of titanium.

Document DE 197 37 470 A1 discloses a cutting body with coatings that include at least one multi-phase coat. The layer system produced by CVD process contains, for example, a zirconium carbonitride coat (cubic ZrCN) and $ZrO_2$ in monocline and/or tetragonal form.

While the crystalline ZrCN matrix acts as a hard coating, the embedded $ZrO_2$ acts as a dry lubricant.

Likewise, document DE 196 41 468 A1 also discloses a composite element, for example, a cutting tool having multi-layer coatings. The layer system includes thin-layer $Al_2O_3$ coats and/or $ZrO_2$ coats.

Document DE 195 18 927 discloses cutting inserts featuring a multi-layer layer system produced by CVD process. The cutting inserts are provided with a so-called ceramic composite coating which contains a continuous metal oxide phase and a discontinuous metal oxide phase. Consequently, this is a two-phase metal oxide layer, which, for example, consists of a continuous $Al_2O_3$ phase in which discrete $ZrO_2$ particles or $Y_2O_3$ particles are embedded.

The crystalline composition of the continuous phase defines the layer properties and thus, as a rule, results in rather hard yet brittle coats.

Based on this, it is the object of the invention to improve the cutting tool.

This object is attained with the features of an embodiment, the cutting tool (1) comprising a base body (2), which supports a layer system (3) comprising at least one mono-ohase metastable, at least ternary oxide layer (6), said layer comprising a major component and at least one minor component formed bv different chemical elements selected from the following group: elements of subgroup IV, V or VI of the Periodic System of the Elements, aluminum and silicon; and an embodiment, the cutting tool (1) comprising a base body (2), which supports a layer system (3) comprising at least one two-phase or multi-phase layer (8) containing as the first phase (9) a compound in an amorphous matrix phase and as the second phase (11) crystallites consisting of an oxide.

The cutting tool in accordance with the invention comprises a base body which is provided with a layer system to which at least one mono-phase, metastable ternary oxide layer is applied. In addition to oxygen, the ternary oxide layer contains at least two other chemical elements, e.g., aluminum and chromium. Referring to another modification, the oxide contains aluminum and zirconium. One of the elements, e.g., aluminum, is referred to as the major component and the other, e.g., chromium or zirconium, is referred to as the minor component. In any event, both elements are selected from a group belonging to the fourth, fifth and sixth subgroup of the Periodic Table of the Elements. In addition, aluminum and silicon belong to this group. For example, an inventive ternary oxide layer is an aluminum-zirconium oxide layer, which, as a crystalline layer, has the crystal structure of aluminum oxide, wherein a few of the aluminum crystal lattice sites are occupied by zirconium atoms. In so doing, however, the composition of the layer is such that the oxide is present in a single metastable phase, i.e., no binary oxide crystals are embedded in the oxide layer. The fact that individual aluminum lattice sites are occupied by zirconium results in a distortion of the crystal lattice of the oxide, which could mean a significant hardening of said oxide. Consequently, the combination of the features of an embodiment, the cutting tool (1) comprising a base body (2), which supports a layer system (3) comprising at least one mono-phase metastabl, at least ternary oxide layer (6), said layer comprising a major component and at least one minor component firmed by different chemical elements selected from the following group: elements of subgroup IV, V or VI of the Periodic System of the elements, aluminum and silicon, opens the path to oxidic layers displaying greater hardness.

Depending on the selection of the major component and the minor component, the lattice can be distorted by positive compressive stress or by negative tensile stress. If aluminum is the major component and zirconium is the minor component, this leads to occurrences of compressive stress in the crystal lattice. However, if zirconium is the major component and aluminum is the minor component, this leads to occurrences of tensile stress. The selection of the content (in atom percent) of the major component and the minor component, in so doing, is decided as a function of the respectively used elements, so that the oxide layer is present in a single phase, thus avoiding that two phases are adjacent to each other. Such metastable layers can preferably be deposited by PVD process.

In addition to the major component, the minor component and oxygen, the oxide layer in accordance with Claim 2 can contain another chemical element, e.g., an element selected from the aforementioned group. For example, in the case of $(Al,Zr)_2O_3$, chromium may act as the additional minor component, thus resulting in the formation of an $(Al,Zr,Cr)_2O_3$ layer. The formation of this layer is possible by PVD process with mixed targets or separate targets. In so doing, additional improvements regarding hardness, as well as—at least up to a certain extent—regarding a reduction of the brittleness of the oxide layer can be specifically achieved.

The oxide layer preferably is a mixed substitution crystal in mono-crystalline or poly-crystalline form. By performing the process in an appropriate manner, the ratio of the major component to the minor component can be varied within the layer in a direction perpendicular to the layer. For example, a distinct gradient of the minor component from one side of the layer toward the other side of the layer may be desired and achieved. Thus, coats can be produced, which, e.g., exhibit a different state of stress on their base than on their upper side. It is also possible to divide the layer into sub-layers, e.g., in that the percentage amount of the minor component is varied—one or more times—from the base side of the layer toward the upper side. As a result of this, special characteristics as to viscosity and toughness can be achieved.

The minor component accounts for a content of more than one atom percent of the total atomic number of the oxidic layer. This minor component does not simply represent a contaminant.

As an alternative to the metastable ternary oxide layer, the cutting tool may also be provided with a two-phase layer, whereby one phase is an amorphous matrix phase and the second phase consists of an oxide. The combination of an amorphous phase with the oxidic crystalline phase opens the door to special properties, in particular, in view of high hardness combined with high viscosity.

Preferably, the oxide is an oxide of one or more elements of the fourth, fifth or sixth subgroup of the Periodic Table of the Elements, aluminum or silicon. This oxide may be a binary oxide, which contains merely one substance selected from the aforementioned group. Preferably, however, it is also possible to use ternary or even more complex oxides. They then form, e.g., mixed substitution crystals that are embedded in the amorphous phase, in the crystallites. If a ternary oxide is used, the involved elements preferably are of the aforementioned group, whereby they are present in different proportions. Alternatively, however also two binary oxides may be embedded next each other as crystallites in the amorphous phase.

Preferably, the amorphous phase is a covalently bonded coat. It may be a CN coat consisting only of carbon and nitrogen, an oxide coat or a ceramic coat. A ceramic coat, e.g., is a silicon carbide coat. Alternatively, a hard metal material coat may be used as the amorphous phase.

The layer system may comprise additional layers which have the same composition as the layers in accordance with an embodiment, the cutting tool (1) comprising a base body (2), which supports a layer system (3) comprising at least one mono-phase metastable, at least ternary oxide layer (6), said layer comprising a major component and at least one minor component formed by different chemical elements selected from the following group: elements of subgroup IV, V or VI of the Periodic System of the Elements, aluminum and silicon; or an embodiment, the Cutting tool (1) comprising a base body (2), which supports a layer system (3) comprising at least one two-phase or multi-phase layer (8) containing as the first phase (9) a compound in an amorphous matrix phase and as the second phase (11) crystallites consisting of an oxide. Alternatively or additionally, additional layers, e.g., hard metal material layers in accordance with an embodiment, the cutting tool (1) comprising a base body (2), which supports a layer system (3) comprising at least one mono-phase metastable, at least ternary oxide layer (6), said layer comprising a major component and at least one minor component formed by different chemical elements selected from the following group: elements of subgroup IV, V or VI of the Periodic System of the Elements, aluminum and silicon, wherein the layer system (3) comprises additional layers, characterized in that the layer system (3) comprises at least one metal hard substance layer, which is a TiAlN coat, an AlCr coat, a nitride-carbide, carbonitride or oxocarbonitride coat of one or more metals of subgroup IV, V or VI of the Periodic Table of the Elements; or a layer system in accordance with an embodiment, the cutting tool (1) comprising a base body (2), which supports a layer system (3) comprising at least one mono-phase metastable, at least ternary oxide layer (6), said layer comprising a major component and at least one minor component formed by different chemical elements selected from the following group: elements of subgroup IV, V or VI of the Periodic System of the Elements, aluminum and silicon, wherein the layer system (3) comprises additional layers, characterized in that the layer system (3) is at least one layer of a ternary or more complex metal oxide having the composition (Me1 Me2, ...)×(O, B, C, N) with a dominant oxygen content in the non-metals, whereby the involved metals (Me1, Me2, ...) are selected from a group belonging to subgroup IV, V or VI of the Periodic Table of the Elements, aluminum and silicon, may be provided. Preferably, the inventive layer and, also preferably, the entire layer system, are produced by means of a PVD process.

The drawing shows exemplary embodiments of the invention. They show in

Figure 3:
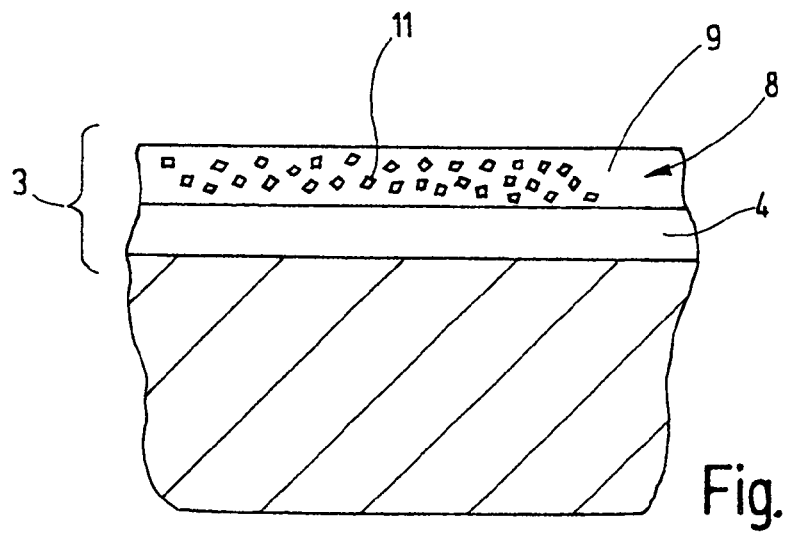
Figure 1:
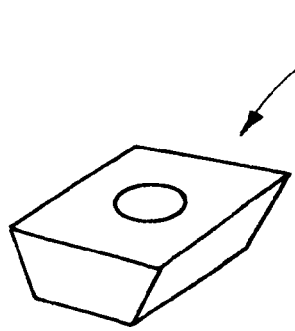
Figure 4:
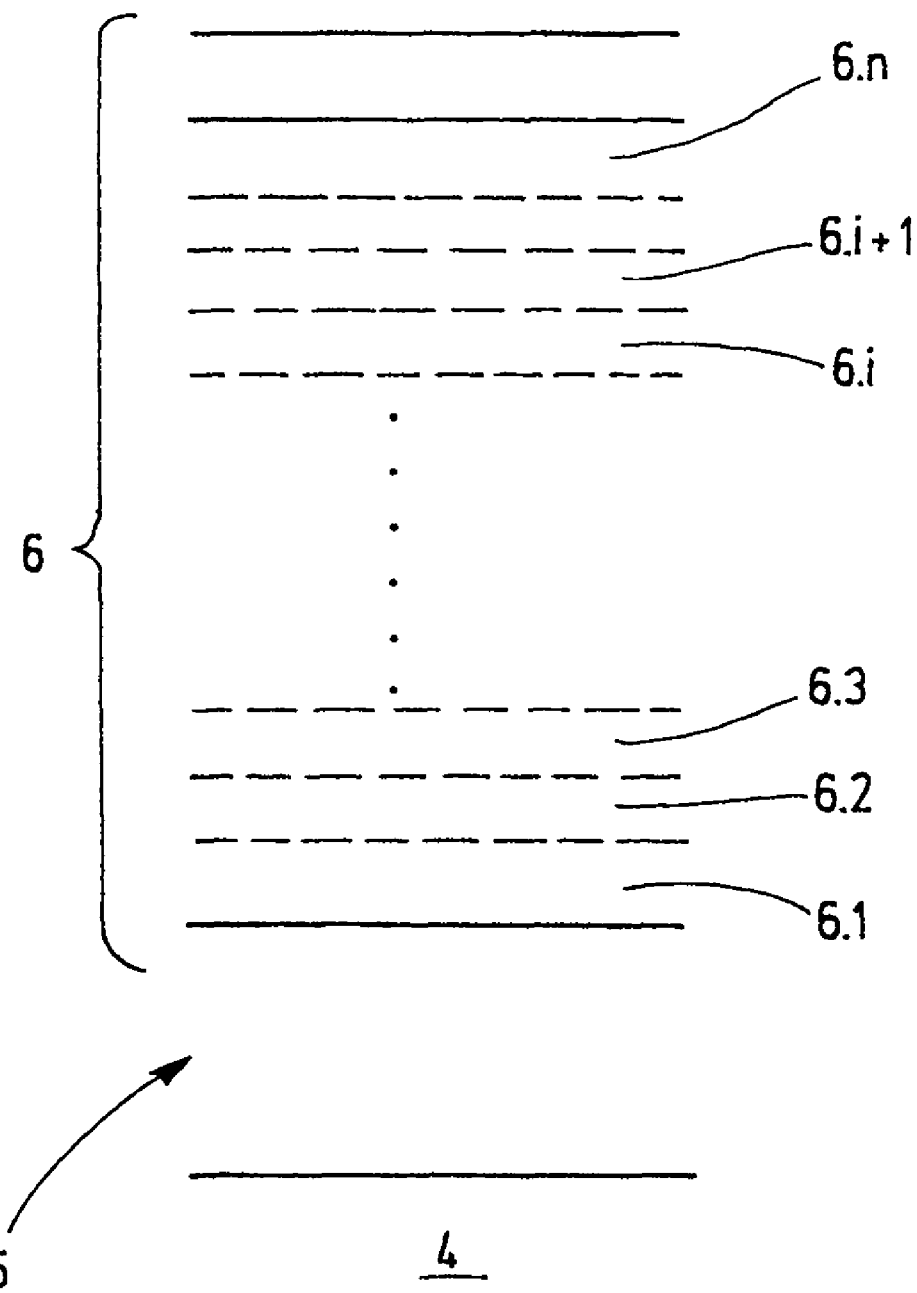

FIG. 1 a perspective schematic illustration of a cutting tool;

FIG. 2 a detail of a sectional view of the cutting tool in accordance with FIG. 1;

FIG. 3 a detail of a sectional view of an alternative embodiment of the cutting tool in accordance with FIG. 1; and, FIG. 4 an alternative embodiment of a layer system of a cutting tool in accordance with FIG. 1.

FIG. 1 shows a cutting plate 1 as an example of a cutting tool. The cutting plate 1 consists of a base body 2, a sectional view of which is provided by FIG. 2, and, e.g., of cobalt-bound sintered tungsten carbide. The base body 2 is coated with a layer system 3 that has been applied by means of a PVD process. Preferably, this base body has a thickness between 5 µm and 30 µm. Preferably, the layer system consists of several individual layers 4, 5, 6, 7, which may have different compositions. For example, the lower layers 4, 5 that adhere to the base body 2 are titanium-based, such as, e.g., they consist of titanium nitride or titanium carbonitride or the like. Alternatively, the layer 5 may be an adhesion imparting layer for a superimposed oxidic layer 6. The oxidic layer 6 consists of a ternary oxide in the metastable phase. For example, it is $(Al,Zr)_2O_3$, i.e., an aluminum oxide, wherein a few aluminum atoms are substituted with zirconium atoms. Aluminum is a major component, and zirconium is a minor component. The latter accounts for less than 10 at %, and, preferably for only 3 at % or 4 at %, of the metal content. It is a mixed substitution crystal which is present in a single phase. Crystallites of $Al_2O_3$ or $ZrO_2$ are not present (i.e., no spinel structure). The zirconium content is clearly above one atom percent, whereby this content is determined in such a manner that the layer 6 is imparted with the desired toughness.

The layer 6 has been produced by a reactive PVD process, for example, in a PVD coating plant using AlZr mixed targets. Such a target may essentially consist of aluminum, for example, and contain approximately two atom percent of zirconium. In a closed magnetic field arrangement of the PVD coating plant, a plasma atmosphere is generated at a low pressure of 0.8 Pa, for example. This atmosphere consists essentially of argon with oxygen. A PVD magnetron process is used, in which case an argon plasma is ignited in front of the target. High-power cathode sputtering (pulsed DC magnetron sputtering) results. The pulse frequency in magnetron sputtering may, e.g., be fixed at 90 kHz with an on-time of 80% (pulse/pause ratio of 4 to 1). A pulsed substrate bias voltage (bias) of −200 Volts at a pulse frequency of 70 kHz is advantageous. The substrate temperature may be maintained at 650° C. The aluminum vapor or zirconium vapor generated in this manner by the target at a specific target output of approximately 6 W/cm$^2$ deposits—with the addition of oxygen as the reactive gas—as a mono-phase, metastable mixed crystal in the form of layer 6. The zirconium atoms are embedded in an γ-aluminum oxide layer (on aluminum oxide lattice sites) and create lattice distortions in the Al$_2$O$_3$ crystal. This distortion hardens the layer. The resultant coat has a thickness of 0.5 to 10 μm, preferably 2 to 4 μm. Depending on the desired layer thickness, the duration of deposition is 30 minutes to 6 hours.

However, it is also possible to use separate aluminum targets and zirconium targets. This has the advantage that, by controlling the cathode sputtering on the respective target, the mixing ratio of aluminum (major component) to zirconium (minor component) can be adjusted as desired, or can even be modulated within one layer. The resultant, mostly ternary oxide layer can also be configured as a multi-layer coating. For example, this can be achieved by the periodic variation of the target bombardment or of the composition of the process atmosphere, e.g., in that, from time to time, minimal quantities of nitrogen are injected. The result is a ternary oxidic multi-layer coat in which oxide nitride layers are incorporated. Also, layers of binary oxides may be embedded in the ternary oxide layer.

FIG. 4 shows an example of such a multi-layer structure of layer 6. The layer 6 is subdivided into sub-layers 6.1 through 6.$n$ that can be differentiated from each other. At least one of these sub-layers 6.1 through 6.$n$ is a mono-phase, metastable, at least ternary oxide layer. At least one of the remaining layers differs from this oxide layer by its chemical composition and/or structure. This layer may also be a mono-phase ternary oxide layer having a different chemical composition or display merely different atom percent numbers of the involved elements. For example, the sub-layer 6.1 may be an (Al,Zr)$_2$O$_3$ layer and the sub-layer 6.2 may be an Al$_2$O$_3$ layer. In this manner, respectively one ternary (or higher) oxide layer may alternated with a binary oxide layer. The layers interposed between the at least ternary oxide layers, however, can also exhibit other features to differentiate them from the ternary oxide layers. For example, they may be multi-phase or they may additionally contain other chemical elements, or even may not contain elements of the metastable, ternary oxide layer. In this manner, the individual layers of the multi-layer system may be distorted with respect to each other in order to affect the mechanical properties in a specific manner.

The target bias is preferably pulsed at 10 to 100 kHz. Preferably, it is pulsed in a bipolar manner, whereby the negative voltage ranges between −200 and −400 Volts, and the positive voltage is preferably at around +100 Volts. Preferably, push-pull pulsing is used. For example, two Al—Zr mixed targets having a composition ratio of 97 at % to 3 at % may be used. They are subjected to bipolar pulsing in a dual magnetron. A process temperature of 600° C. or more and a substrate bias voltage of −80 Volts may be used for the process. The process pressure may be, for example, 0.7 Pa Argon. Oxygen is injected as the reactive gas.

Using the following conditions, it is also possible to produce (Al,Cr)$_2$O$_3$ coats (ternary oxide layer) that have been distorted—and thus hardened—as a result of embedding chromium in aluminum oxide:

Pulsed DC magnetron sputtering (e.g., bipolar, 80 kHz, On-Time 80%);
Pressure: 0.8 Pa;
Pulsed substrate bias voltage (bias): −150 V (bipolar, 70 kHz);
Temperature: 600° C.;
Target: aluminum-chromium mixed target with 1 to 6 at % Cr;
Specific target output: ca. 6 W/cm$^2$;
Closed magnetic field arrangement;
Duration of deposition: depending on the desired layer thickness, 30 minutes to 6 hours;
Layer thickness: 0.5 to 10 μm, preferably 2 to 4 μm.

Aluminum forms the major component and chromium the minor component. The latter accounts preferably for less than 10 at %, and, more preferably, for only 3 or 4 at %, of the metal content.

The layer 7, for example, may be applied as a decorative coat to layer 6. This coat may be colored, act as a wear indicator or alter friction characteristics. The layer system 3 may also be configured in a different manner. For example, additional layers may be interposed between the layer 4 and the layer 6, which layers can be, e.g., metal hard substance layers. These can be TiAlN coats, TiCN coats, AlCr(O,N) coats, a nitride, carbide, carbon nitride or oxocarbonitride coat of one or more metals of the fourth, fifth or sixth subgroup of the Periodic Table of the Elements. In addition, one or more additional layers having the composition (Me1, Me2, . . . )×(O, B, C, N) with a dominant oxygen content in the non-metals may be provided, whereby the involved metals (Me1, Me2, . . . ) are selected from a group that includes the fourth, fifth or sixth subgroup of the Periodic Table of the Elements, as well as aluminum and silicon. In this case, this is a ternary or more complex, predominantly oxidic, layer.

FIG. 3 shows a modified embodiment of the layer system 3. It contains at least one layer 8 that is configured as a two-phase layer. Above or below said layer, one additional layer 4 may be provided, said layer being configured, e.g., as a TiN coat or as a miscellaneous coat.

The two-phase layer 8 contains an amorphous matrix 9, which, e.g., consists of a covalently bonded coat, i.e., a non-metal and essentially metal-free CN coat. Crystallites 11 are embedded in this covalently bonded amorphous matrix, said crystals being oxidic. These crystals consist, e.g., of aluminum oxide, zirconium oxide or another binary oxide. The oxidized metal is preferably selected from the fourth, fifth or sixth subgroup of the Periodic Table of the Elements, or said metal is aluminum or silicon. These crystallites 11 form a second phase. Additional phases, i.e., a third, fourth, fifth phase, etc., of other oxides or of other substances may be provided. Furthermore, the crystallites 11 may be formed of ternary oxides as have been described above in conjunction with layer 6. The interaction between the amorphous matrix phase and the second oxidic phase makes it possible to form coatings that are hard, as well as viscous. The embedded crystallites may be ternary oxides of the above-described type.

With the use of the PVD process, cutting tools are provided with a coating that is a mono-phase ternary or more complex oxide. By appropriately defining the content of the involved major component and minor component in terms of atom percent, distortions of the resultant oxide can be controlled in a specific manner and utilized to influence the properties of said oxide. Alternatively, the layer may have an amorphous matrix phase and oxide crystallites embedded therein. These oxide crystallites may be binary, ternary or more complex. One or more different crystallite types may be present next to each other.

The invention claimed is:

1. A cutting tool comprising a base body, which supports a layer system comprising at least one mono-phase metastable at least ternary oxide layer, wherein the at least one mono-phased metastable at least ternary oxide layer is produced using a physical vapor deposition process (PVD),
   wherein the at least one mono-phased metastable at least ternary oxide layer is a substitution mixed crystal,
   wherein the at least one mono-phased metastable at least ternary oxide layer includes a main component and at least one minor component,
   wherein the main component forms a predominant proportion and the at least one minor component forms a smaller proportion of more than 1 atomic percent and up to 4 atomic percent,
   wherein the main component is aluminum and the at least one minor component is chromium, titanium, or zirconium, and
   wherein the at least one mono-phased metastable at least one ternary oxide layer has the structure of a γ-aluminum oxide layer.

2. The cutting tool in accordance with claim 1, wherein the the at least one mono-phased metastable at least ternary oxide layer contains another chemical element.

3. The cutting tool in accordance with claim 1, wherein the cutting tool has at least one additional layer located between the base body and the at least one mono-phased metastable at least ternary oxide layer.

4. The cutting tool in accordance with claim 3, wherein the at least one additional layer has a composition that is different from adjacent layers,
   wherein the at least one additional layer is produced using a physical vapor deposition process (PVD),
   wherein the at least one additional layer is present as a substitution mixed crystal,
   wherein the at least one additional layer includes a main component and at least one minor component,
   wherein the main component forms a predominant proportion and the at least one minor component forms a smaller proportion of more than 1 atomic percent and up to 4 atomic percent, and
   wherein the main component is aluminum and the at least one minor component is chromium, titanium, or zirconium.

5. The cutting tool in accordance with claim 1, the layer system contains at least one additional layer.

6. The cutting tool in accordance with claim 5, wherein the at least one additional layer is a metallic hard material layer, which is a TiAlN layer, an AlCr layer, a nitride layer, a carbide layer, carbonnitride layer or oxocarbonnitride layer of one or more metals of group IV, V, or VI of the periodic system of chemical elements.

7. The cutting tool in accordance with claim 5, wherein the layer system is at least one layer of a ternary or more complex metal oxide of the composition $Me_1$, $Me_2(O, B, C, N)$, wherein $Me_1$ and $Me_2$ each independently represents aluminum, silicon, or a metal of group IV, V, or VI.

* * * * *